(12) United States Patent
Luu et al.

(10) Patent No.: US 7,409,329 B2
(45) Date of Patent: Aug. 5, 2008

(54) FLEXIBLE SPDIF VERIFICATION TOOL

(75) Inventors: Cam Minh Luu, San Diego, CA (US); Keith L. Klingler, San Diego, CA (US); Glen A. Grover, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 464 days.

(21) Appl. No.: 10/871,209

(22) Filed: Jun. 18, 2004

(65) Prior Publication Data

US 2005/0283350 A1 Dec. 22, 2005

(51) Int. Cl.
*G06F 17/50* (2006.01)
(52) U.S. Cl. .......................................... 703/14; 703/19
(58) Field of Classification Search ................... 703/14, 703/19; 716/5; 714/741; 702/66, 56
See application file for complete search history.

(56) References Cited

U.S. PATENT DOCUMENTS

| | | | | |
|---|---|---|---|---|
| 5,535,223 A | * | 7/1996 | Horstmann et al. | 714/744 |
| 6,185,726 B1 | * | 2/2001 | Chou | 716/18 |
| 6,578,181 B2 | * | 6/2003 | Hisada et al. | 716/5 |
| 7,079,997 B1 | * | 7/2006 | Hsu et al. | 703/14 |
| 2001/0033629 A1 | * | 10/2001 | Ito | 375/368 |

* cited by examiner

*Primary Examiner*—Paul L Rodriguez
*Assistant Examiner*—Luke Osborne
(74) *Attorney, Agent, or Firm*—McAndrews, Held & Malloy, Ltd.

(57) ABSTRACT

A system and method of verifying the format of a simulated signal produced during the simulation of an electronic circuit is disclosed. One aspect of the present invention includes a method of extracting timing information from a single simulated serial digital audio signal that comprises both data and clock. An embodiment of the present invention may verify operation of the simulated electronic circuit by setting the value of a first simulated signal according to predetermined events that occur in a second simulated signal. The second simulated signal may be parsed using timing information extracted from the second simulated signal, and the format of the second simulated signal may be matched against a predetermined format based upon the results of the parsing. An embodiment of the present invention may, for example, be employed during software simulation to verify the operation of exemplary devices such as application specific circuits (ASICs) used in the generation of signals meeting the Sony/Philips Digital Interconnect Format (SPDIF).

22 Claims, 11 Drawing Sheets

| T ~610 | DATA ~612 | V 614 | U 616 | C 618 | P 620 | PChk ~622 |
|---|---|---|---|---|---|---|
| X | FA0100 | 0 | 0 | 0 | 1 | P_OK |
| Y | FB0100 | 0 | 0 | 0 | 0 | P_OK |
| Z | FA0200 | 0 | 0 | 1 | 0 | P_OK |
| Y | FB0200 | 0 | 0 | 1 | 0 | P_ERR |
| X | FA0300 | 0 | 0 | 0 | 0 | P_OK |
| Y | FA0400 | 0 | 0 | 0 | 1 | P_OK |

Figure 6

FLEXIBLE SPDIF VERIFICATION TOOL

RELATED APPLICATIONS

[Not Applicable]

FEDERALLY SPONSORED RESEARCH OR DEVELOPMENT

[Not Applicable]

[MICROFICHE/COPYRIGHT REFERENCE]

[Not Applicable]

BACKGROUND OF THE INVENTION

A suite of software verification tools is frequently used as part of a test environment during the development of application specific integrated circuits (ASICs). Prior to committing an ASIC design to silicon, it is common to run a suite of simulations of the ASIC device to verify that the design will function as intended. Often, developers convert portions of this suite of simulation tools from other projects in order to shorten development time.

A problem that sometimes arises in the testing of ASICs designed to generate signals in the Sony/Philips Digital Interconnect Format (SPDIF) involves access to a clock for the data contained within the SPDIF signal. The SPDIF signal is composed of clock and data encoded as a single signal. An engineer involved in the testing of an ASIC generating an SPDIF compliant signal may have software used in testing another SPDIF-related ASIC design. That software may be capable of checking the SPDIF signal generated by the ASIC being simulated. However, due to the fact that the SPDIF signal contains its own clock signal, the software used for testing the simulated SPDIF signal typically requires a clocking signal from within the code simulating the new ASIC device design. The designer may therefore be forced to locate, or in a worst case scenario, synthesize a suitable clocking signal from signals within the ASIC design simulation software for each ASIC design, for use by the simulation software used to verify the SPDIF signal.

A second problem frequently appears once the data carried by the SPDIF signal is recovered. A SPDIF subframe contains a number of types of data, some having no defined timing relationship to others. This complicates testing, in that changes in the ASIC design that result in the generation of a valid SPDIF signal may be misinterpreted by existing design verification tools as representing an error. Currently available verification tools collect the sequence of output transitions and compare them to a "golden" reference file. Each line of output of a present day SPDIF verification tool may contain the following data elements from an SPDIF subframe:

1. subframe preamble
2. audio sample payload
3. channel status bit (C)
4. validity bit (V)
5. user data bit (U)
6. parity bit (P)

Often, in the process of porting a test to a new design, element [2] may be shifted in time relative to elements [1], [3], [4], and [5]. This may cause element [6] to mismatch and made it impossible to find matching lines between the new design output and the "golden" or reference file. This may happen even in cases where each of the individual elements match the reference file contents and the overall design is functioning properly.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Aspects of the present invention may be found in a method of verifying operation of an electronic circuit employing a software-based circuit simulator. A method in accordance with an embodiment of the present invention may comprise simulating the electronic circuit, where the simulation may produce at least a first simulated signal. The method may further comprise extracting signal timing information from the at least a first simulated signal, parsing the at least a first simulated signal using the extracted signal timing information, and determining whether the at least a first simulated signal matches a predetermined format based upon the parsed signal. In an embodiment of the present invention, the electronic circuit may comprise a digital circuit, and the at least a first simulated signal may comprise a representation of audio information. The predetermined format may comprise a representation compliant with the serial interface format specified by the Audio Engineering Society AES3-2003 standard. The method may further comprise retrieving electrical signal information from a storage device, and setting a value of at least a second simulated signal using the retrieved electrical signal information. In an embodiment of the present invention, the setting may comprise identifying the occurrence of a pre-selected pattern within the at least a first simulated signal, and timing the setting of a value of the at least a second simulated signal relative to the occurrence of the identified pattern. The method may further comprise recording at least one result of at least one of the parsing and the determining.

Additional aspects of the present invention may be observed in a machine-readable storage having stored thereon a computer program having a plurality of code sections for verifying operation of an electronic circuit. The code sections may be executable by a machine for causing the machine to perform operations comprising simulating the electronic circuit, where the simulation produces at least a first simulated signal. The operations may also comprise extracting signal timing information from the at least a first simulated signal, parsing the at least a first simulated signal using the extracted signal timing information, and determining whether the at least a first simulated signal matches a predetermined format based upon the parsed signal. The electronic circuit may comprise a digital circuit, and the at least a first simulated signal may comprise a representation of audio information. The predetermined format may comprise a representation compliant with the serial interface format specified by the Audio Engineering Society AES3-2003 standard. The operations may further comprise retrieving electrical signal information from a storage device, and setting a value of at least a second simulated signal using the retrieved electrical signal information. The setting may comprise identifying the occurrence of a pre-selected pattern within the at least a first simulated signal, and timing the setting of a value of the at least a second simulated signal relative to the occurrence of the identified pattern. In addition, the operations may comprise recording at least one result of at least one of the parsing and the determining.

Still other aspects of the present invention may be seen in a system for verifying operation of an electronic circuit, where the system comprises at least one processor capable of simulating the electronic circuit, the simulation producing at least a first simulated signal. The at least one processor may be capable of extracting signal timing information from the at least a first simulated signal, and of parsing the at least a first simulated signal using the extracted signal timing information. The at least one processor may also be capable of determining whether the at least a first simulated signal matches a predetermined format based upon the parsed signal. The electronic circuit may comprise a digital circuit, and the at least a first simulated signal may comprise a representation of audio information. The predetermined format may comprise a representation compliant with the serial interface format specified by the Audio Engineering Society AES3-2003 standard. An embodiment in accordance with the present invention may also comprise at least one processor capable of retrieving electrical signal information from a storage device, and of setting a value of at least a second simulated signal using the retrieved electrical signal information.

In an embodiment of the present invention, the setting may comprise identifying the occurrence of a pre-selected pattern within the at least a first simulated signal, and timing the setting of a value of the at least a second simulated signal relative to the occurrence of the identified pattern. The system may also comprise at least one processor capable of recording at least one result of at least one of the parsing and the determining.

Further aspects of the present invention may be observed in a method of extracting timing information from a first simulated signal in a circuit simulator. Such a method may comprise initializing timing of a first time period. The method may also comprise setting a second simulated signal to a first logic level and initializing timing of a second time period, if at least one of the completion of the first time period and a change in logic level of the first simulated signal has occurred. In addition, the method may comprise setting the second simulated signal to a second logic level and initializing timing of the first time period, if the second time period has completed. Elements of the above method may be repeated.

These and other features and advantages of the present invention may be appreciated from a review of the following detailed description of the present invention, along with the accompanying figures in which like reference numerals refer to like parts throughout.

BRIEF DESCRIPTION OF SEVERAL VIEWS OF THE DRAWINGS

FIG. 6 shows an exemplary tabular arrangement of fields of information extracted from a simulated SPDIF signal such as, for example, the SPDIF signal of FIG. 1, or the SPDIF signal of FIG. 5.

DETAILED DESCRIPTION OF THE INVENTION

Aspects of the present invention relate to the verification of signals generated during the simulation of digital circuits. More specifically, certain aspects of the present invention relate to methods of verifying the format and contents of a simulated digital signal generated by a software-based device simulation system during design verification of an application specific integrated circuit. Although the discussion that follows describes a specific embodiment of the present invention that may be used for verifying the correct generation of a signal compliant with the Sony/Philips Digital Interconnect Format (SPDIF), an embodiment of the present invention is not limited in this regard. Aspects of the present invention may have application in the verification of simulated signals other than those for the SPDIF interface, without departing from the spirit and scope of the present invention.

Figure 1A:
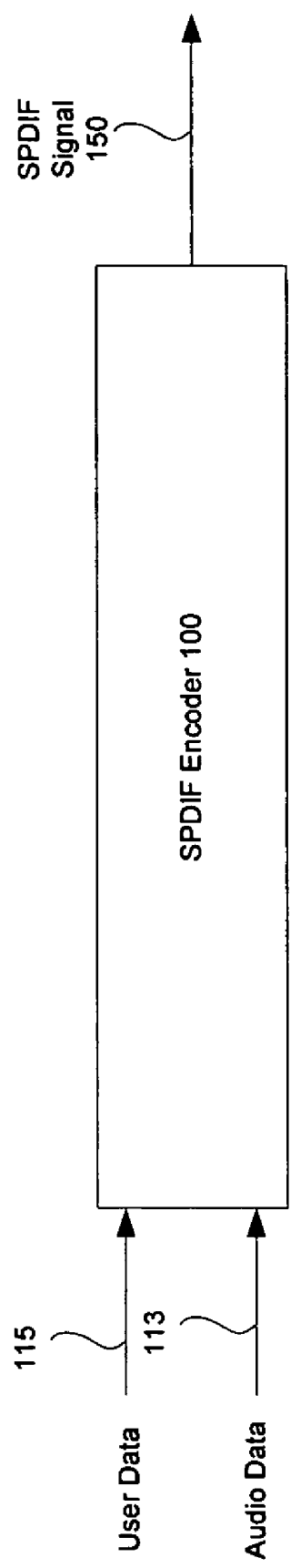
FIG. 1A shows a block diagram of an exemplary SPDIF encoder that generates an SPDIF signal compliant with the Sony/Philips Digital Interconnect Format (SPDIF), with which an embodiment of the present invention may be practiced.

FIG. 1A shows a block diagram of an exemplary SPDIF encoder 100 that generates an SPDIF signal 150 compliant with the Sony/Philips Digital Interconnect Format (SPDIF), with which an embodiment of the present invention may be practiced. The SPDIF encoder 100 of FIG. 1A accepts user data 115 and audio data 113 for use in the generation of the SPDIF signal 150. The SPDIF signal 150 may comprises the user data 115 and audio data 113, status and error control information, and clock information. The audio data 113 may comprise audio data for two audio channels.

Figure 1B:
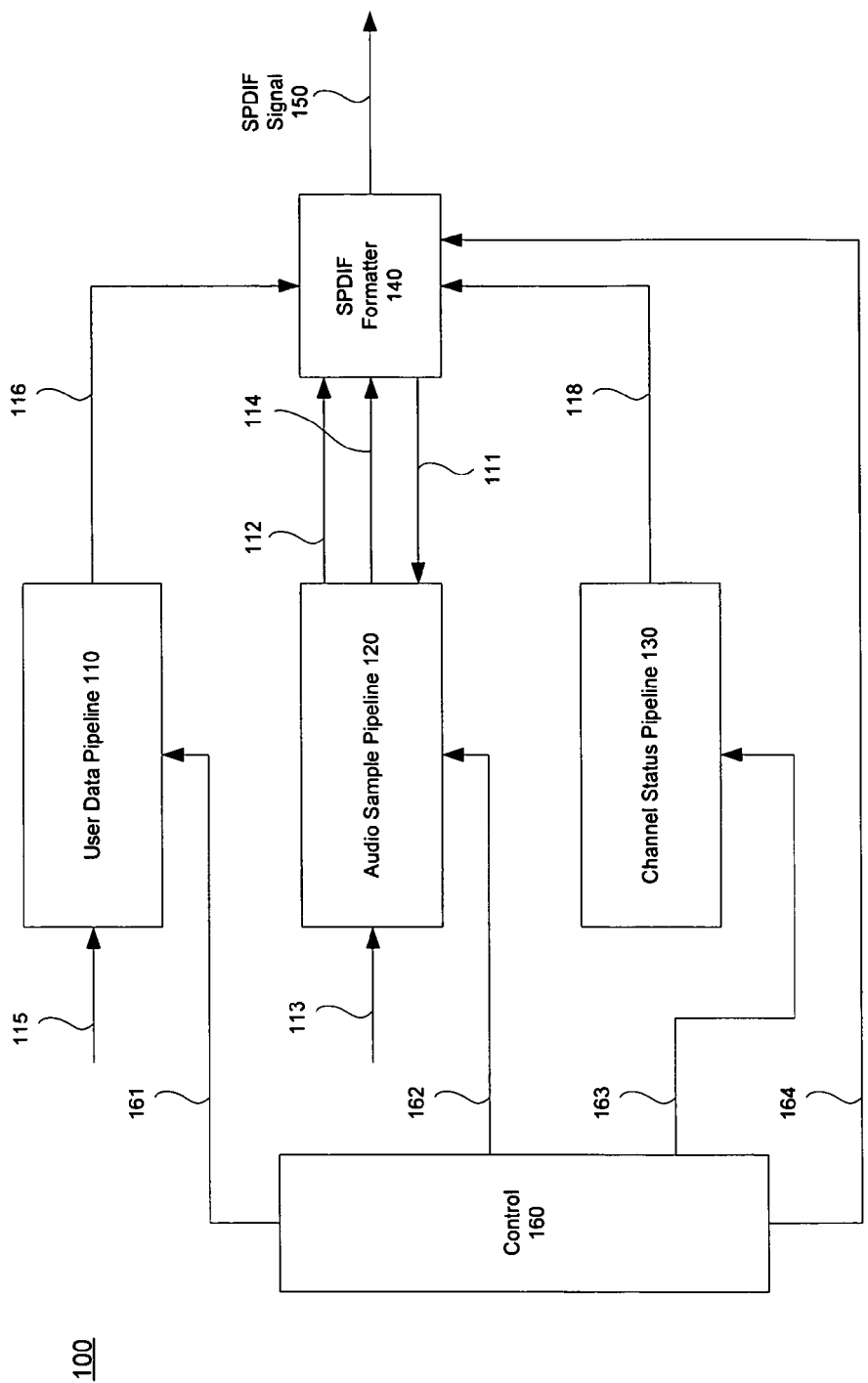
FIG. 1B shows an illustration of a more detailed block diagram of an exemplary SPDIF encoder, with which an embodiment of the present invention may be practiced.

FIG. 1B shows an illustration of a more detailed block diagram of an exemplary SPDIF encoder 100, with which an embodiment of the present invention may be practiced. The SPDIF encoder 100 of FIG. 1B may, for example, correspond to the SPDIF encoder 100 of FIG. 1A. The exemplary encoder 100 of FIG. 1B comprises a control unit 160 providing control signals to a user data pipeline 110, an audio sample pipeline 120, channel status component 130, and SPDIF formatter 140. The user data pipeline 110 may produce a stream of user data 116 for inclusion by the SPDIF encoding component into the SPDIF signal 150, from user input data 115. In a similar fashion, the audio sample pipeline 120 may produce from a stream of compressed or uncompressed audio data 113, a stream of audio sample data 112 for inclusion by the SPDIF formatter 140 into the SPDIF signal 150. The SPDIF formatter 140 may generate a clock 111 for clocking the audio sample pipeline 120. Each audio sample in the stream of audio samples data 112 may be associated with a validity bit in the stream of validity data 114. In another embodiment, the SPDIF formatter 140 may generate the validity data 114 internally based upon signals from the audio sample pipeline 120 or control unit 160. The audio sample data 112 and validity data 114 may be incorporated into the SPDIF signal 150 by the SPDIF formatter 140. Channel status data 118 from the channel status component 130 may also be assembled as part of the SPDIF signal 150 by the SPDIF formatter 140. The control unit 160 may generate control signals 161, 162, 163, 164 to coordinate the operation of the user data pipeline 110, audio sample pipeline 120, channel status component 130, and SPDIF formatter 140, respectively. Each of control signals 161, 162, 163, 164 may, for example, comprise a number of individual signals for the control of the respective element of the SPDIF encoder 100, and may comprise signals both to and from the respective element.

The exemplary SPDIF encoder 100 of FIG. 1B may, for example, be implemented as part of an application specific integrated circuit (ASIC), and may be verified or checked prior to commitment to production of integrated circuit devices using any one of a number of circuit simulation software tools. Because the SPDIF signal 150 exists within the circuit simulator as the value of an internal program variable, it is not possible to use traditional electrical test instruments to monitor the format and content of such a signal. An embodiment of the present invention, however, may be used to verify or check the contents and format of the simulated SPDIF signal 150 in order to validate the design of the exemplary SPDIF encoder 100.

Figure 2A:
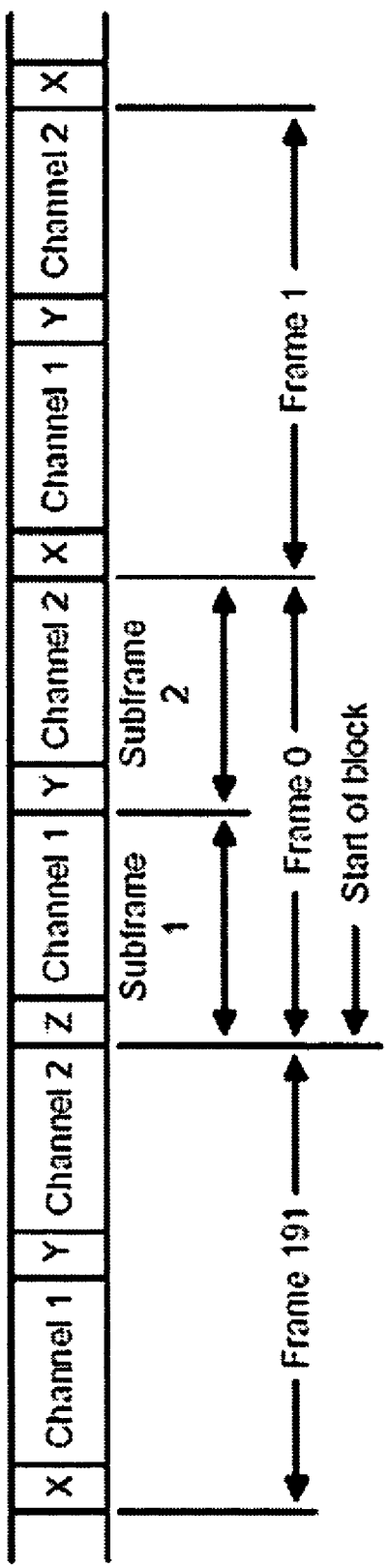
FIG. 2A illustrates the format of an SPDIF signal, with which an embodiment of the present invention may be employed.

FIG. 2A illustrates a high-level view of the format of an SPDIF signal, with which an embodiment of the present invention may be employed. Additional details regarding the format of the signal shown in FIG. 2A may be found in International Electrotechnical Commission standards documents IEC-60958 and IEC-61937, the complete subject matter of which are hereby incorporated herein by reference, in their entirety. A serial SPDIF stream of data is comprised of a sequence blocks, each block comprised of 192 frames. As can be seen in the illustration of FIG. 2A, each frame in the sequence contains two subframes, one subframe for each of two audio channels.

Figure 2B:
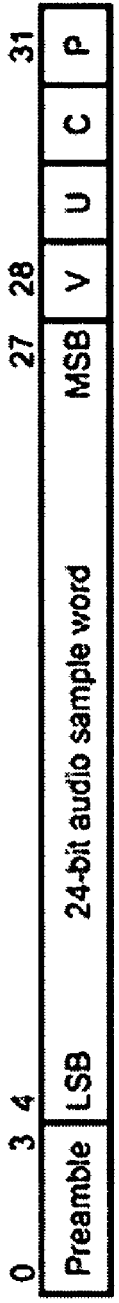
FIG. 2B illustrates the format of an SPDIF subframe capable of transporting a 24-bit audio sample within an SPDIF signal, with which an embodiment of the present invention may be employed.
Figure 2C:
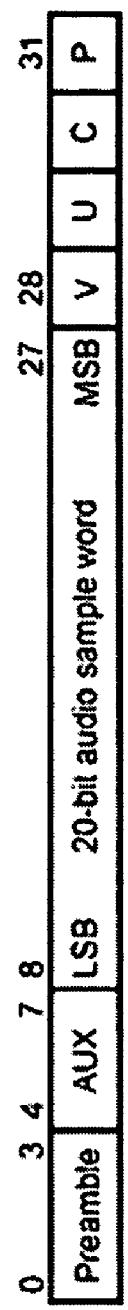
FIG. 2C illustrates the format of an SPDIF subframe capable of transporting an audio sample of 20 or fewer bits within an SPDIF signal, with which an embodiment of the present invention may be employed.

FIG. 2B illustrates the format of a subframe for carrying audio samples of length 21-24 bits within an SPDIF signal, to which an embodiment of the present invention may apply. FIG. 2C illustrates the format of a subframe for carrying audio samples of length 20 or fewer bits within an SPDIF signal, to which an embodiment of the present invention may apply. Each of the subframes formats shown in FIGS. 2B and 2C begin with a preamble that identifies the type of subframe, the type of subframe being one of X, Y, and Z. A subframe containing a preamble of type Z indicates that the subframe starts a new block of 192 frames. The subframe also contains audio sample data, and four single bit fields referred to as the validity bit (V), the user data bit (U), the channel status bit (C), and the parity bit (P), for a total subframe length of 32 bits. Subframes of type X and Y identify the audio channel carried by all other subframes.

The bits in each subframe of an SPDIF-compliant signal are encoded such that a single signal contains both clock and data. Each data bit of a subframe is comprised of two half-cells. The two half-cells are of opposite polarity when the corresponding data bit is a "1", and of the same polarity when the corresponding data bit is a "0". The SPDIF signal always changes polarity on full-cell boundaries, except during special synchronizing preambles, in which the signal remains one polarity for three half-cells. There are 128 half-cell periods in one audio sample period.

One aspect of the present invention relates to the extraction of clock information from a simulated SPDIF signal. An embodiment of the present invention extracts the clock information using one rising edge from each half-cell of the simulated SPDIF signal. In one embodiment of the present invention, the extraction of clock information may use only the SPDIF signal itself, and an integer value, $F_s$, that indicates the approximate audio sample rate in kilohertz (32, 44, 48, etc.) That integer value may be translated into the expected durations of the high and low half-clock periods, in nanoseconds, of the extracted SPDIF clock signal. The mathematical relationship of audio sample rate to the clock duration is as follows:

$$halfOfClockPeriod(\text{ns}) = \frac{1}{Fs(\text{kHz})} \cdot \frac{1}{128} \cdot \frac{1}{2} \cdot \frac{10^9(\text{ns})}{10^3(\text{ms})}$$

In an embodiment of the present invention, the clock signal may be extracted from the simulated SPDIF signal using the exemplary algorithm shown as pseudo-code in Listing 1, below.

---
Listing 1.
---
```
start HIGH timer
loop forever {
    if((HIGH timer expired) or (SPDIF edge)) {
        drive extracted clock signal low
        restart LOW timer
    }
    if(LOW timer expired) {
        drive extracted clock high
        restart HIGH timer
    }
}
```
---

In an embodiment of the present invention, either an SPDIF signal edge or the expiration of the HIGH timer may cause the extracted clock signal to be set low and the restart of the LOW timer. The expiration of the LOW timer causes the extracted clock signal to be set high, and a restart of the HIGH timer. This behavior results in exactly one rising clock signal edge per half-cell, even when the audio sample rate, $F_s$, is set slightly different than the SPDIF audio sample rate of the simulated signal being verified. This is a significant feature of an embodiment of the present invention.

Figure 3:
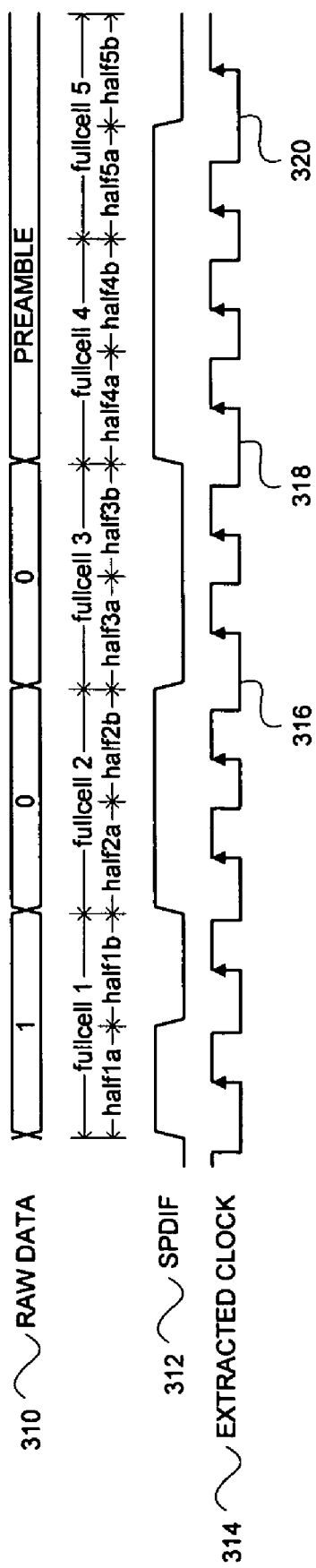
FIG. 3 shows a timing diagram that illustrates a simulated SPDIF signal and an extracted clock signal, in accordance with an embodiment of the present invention.

FIG. 3 shows a timing diagram that illustrates a simulated SPDIF signal 312 and an extracted clock signal 314, in accordance with an embodiment of the present invention. The illustration of FIG. 3 shows the extension of the low periods 316, 318, 320 of the extracted clock signal 314 in the regions near transitions of the simulated SPDIF signal 312, that are caused when the audio sample rate, $F_s$, is set to a slightly higher audio sample rate than the actual sample rate of the simulated SPDIF stream being verified. In this situation, the edges of the simulated SPDIF signal 312 reinitialize the LOW timer. If the audio sample rate, $F_s$, is set to a lower that actual audio sample rate, the low periods 316, 318, 320 of the extracted clock signal 314 may be shorter near the transitions of the simulated SPDIF signal 312.

Figure 4:
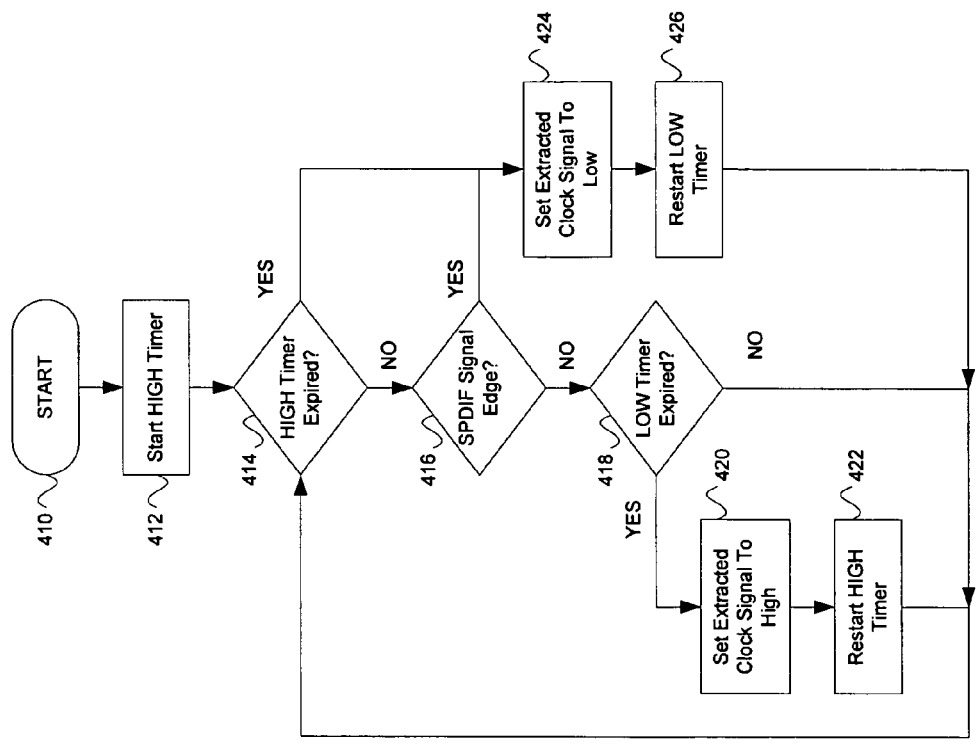
FIG. 4 shows a flowchart of an exemplary method of extracting the clock signal from a simulated SPDIF signal such as, for example, the simulated SPDIF signal of FIG. 3, in accordance with an embodiment of the present invention.

FIG. 4 shows a flowchart 400 of an exemplary method of extracting the clock signal from a simulated SPDIF signal such as, for example, the simulated SPDIF signal 312 of FIG. 3, in accordance with an embodiment of the present invention. The exemplary method of FIG. 4 may correspond, for example, to the algorithm represented in pseudo-code in Listing 1, above. The method of FIG. 4 begins following initialization of the simulator for the ASIC design under test (410). The simulation then starts the HIGH timer (312) using the value of the halfOfClockPeriod variable calculated above, and enters a loop beginning with a check of whether the HIGH timer has expired (314). If the HIGH timer has expired, the simulated extracted clock signal is set to low (324), and the LOW timer is restarted (326), using the value of the halfOfClockPeriod variable calculated above. If the HIGH timer has not expired (314), a check is made as to whether an edge has been detected in the simulated SPDIF signal (316). If an edge has been detected, the simulated extracted clock signal is set to low (324), and the LOW timer is restarted (326), using the halfOfClockPeriod value calculated above. If neither the HIGH timer has expired, nor an edge has been detected in the simulated SPDIF signal, a check is made as to whether the LOW timer has expired (318). If the LOW timer has expired, the simulated extracted clock signal is set to high (320), and the HIGH timer is restarted (322), using the value of the halfOfClockPeriod variable calculated above. If the LOW timer has not expired, the loop of the method continues (314). Although shown in the flowchart of FIG. 4 as was is referred to as an "infinite loop", the illustrated method may be implemented, for example, as a part of other circuit simulation activities.

In an embodiment of the present invention, the amount by which the actual SPDIF audio sampling rate and the audio sampling rate value, $F_s$, may differ may be limited by a sub-portion of the preamble segment of a SPDIF subframe, in which the SPDIF signal is held constant for three half-cell periods. If a variable, periods_3, is the maximum elapsed time between transitions in the simulated SPDIF signal, then the extracted clock will be correct as long as the relationship (5*halfOfClockPeriod)<periods_3<(7*halfOfClockPeriod), is true, where the variable, halfOfClockPeriod, is as calculate from $F_s$, as described above.

In an embodiment of the present invention, the audio sampling rate, $F_s$, that specifies the approximate value of the variable, halfOfClockPeriod, as discussed previously, may be an input to the SPDIF signal verification code, or it may be detected by a SPDIF verifier, automatically. An embodiment of the present invention may use the preamble portion of an SPDIF subframe of the simulated SPDIF signal to automatically detect the actual audio sample rate of the simulated SPDIF signal of the ASIC device design being verified. This may be accomplished as described below.

Figure 5:
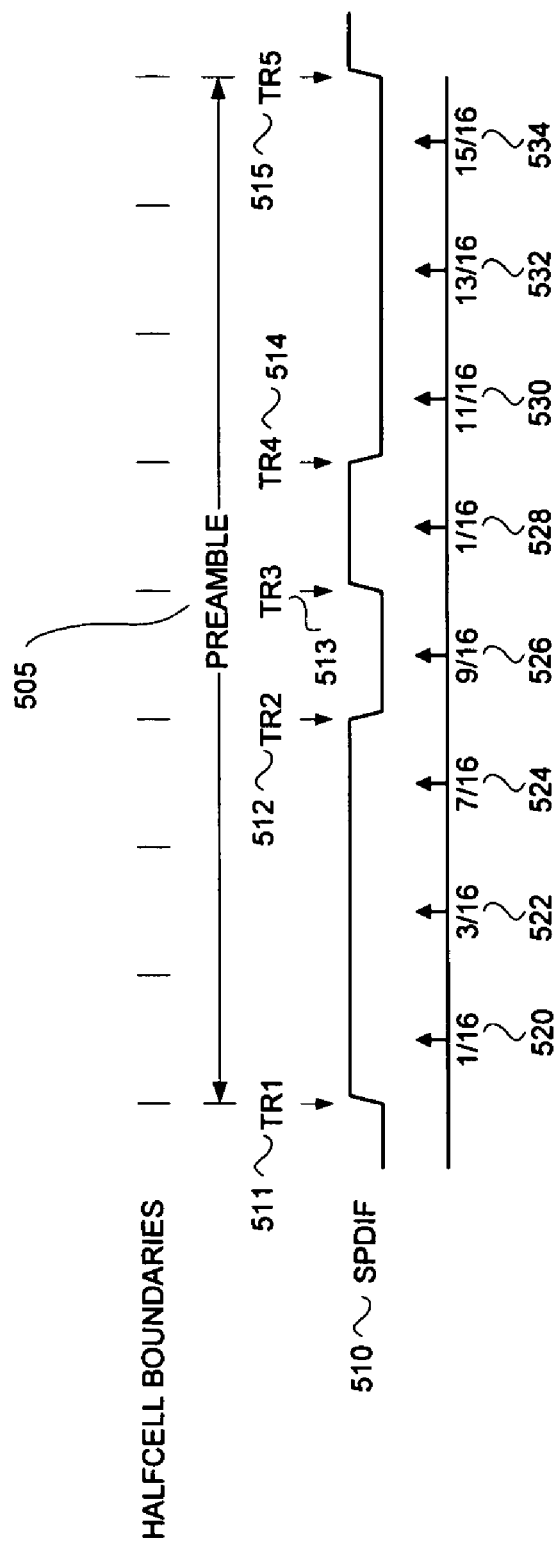
FIG. 5 shows the preamble portion of an SPDIF signal that may correspond to an SPDIF signal of FIG. 1, in accordance with an embodiment of the present invention.

FIG. 5 shows the preamble portion 505 of an SPDIF signal 510, in accordance with an embodiment of the present invention. The SPDIF signal 510 may correspond to the SPDIF signal 150 of FIG. 1. As described above, an SPDIF signal is comprised of a sequence of frames, each frame comprising two subframes. The preamble portion 505 of an SPDIF subframe may take one of three possible signal patterns, each of which can be of one of two polarities. An embodiment in accordance with the present invention may track the simulated times of occurrence, in nanoseconds, of five adjacent transitions, represented by points TR1 511 through TR5 515 on the preamble portion 505 of the simulated SPDIF signal, in order to detect the audio sample rate of the simulated SPDIF signal being verified. Each time a new transition of the simulated SPDIF signal 510 is detected, a proposed preamble period equal to TR5 515 minus TR1 511 may be generated. The transition times, TR1 511 through TR5 515, may then be compared with eight points, 520-534, distributed at equal intervals throughout the preamble period 505, in order to create a proposed preamble pattern byte. If the proposed preamble pattern byte matches a proper preamble pattern, a proposed value for the audio sample rate, $F_s$, is computed and saved, and successful detection is indicated.

Listing 2, below, shows pseudo-code for an exemplary algorithm for automatically detecting the audio sampling rate of an SPDIF signal, in accordance with an embodiment of the present invention.

Listing 2.

```
TR1 = TR2 = TR3 = TR4 = TR5 = 0
while F_s is unknown {
    wait for SPDIF transition;
    TR1 = TR2, TR2 = TR3, TR3 = TR4, TR4 = TR5      // (shift transition
                                                       times to previous)
    TR5 = current time;
    halfcell_time = (TR5-TR1)/8                      // (1/8 of preamble
                                                       period)
    for i=0 to 7 {
        t = TR1 + (halfcell_time*i) + (halfcell_time/2); // (1/16, 3/16...)
        bit = 1
        if( TR1 < t < TR2 or TR3 < t < TR4 )
            bit = 1
        otherwise
            bit = 0
        byte[i] = bit;
    }
    if( byte equals valid preamble pattern ) {
        F_s = 1000000/(halfcell_time*128);            i// (F_s <= 32,44,48 for
                                                        example)
    }
}
```

An additional aspect of the present invention relates to the use of the simulated clock signal to extract from the simulated SPDIF signal, data from the fields of the SPDIF subframes in the simulated SPDIF signal. Using the clock signal extracted from the simulated SPDIF signal, an embodiment of the present invention may perform bi-phase decoding of the simulated SPDIF signal, and extract audio sample and other field data from a decoded SPDIF subframe such as, for example, the subframes shown in FIGS. 2B and 2C. The extracted data may be provided to self-checking algorithms, or stored for later analysis.

FIG. 6 shows an exemplary tabular arrangement of fields of information extracted from a simulated SPDIF signal such as, for example, the SPDIF signal 150 of FIG. 1, or the SPDIF signal 510 of FIG. 5. In the illustration of FIG. 6, the column of data T 610 represents the preamble type of the subframe, while the column of data DATA 612 represents the value of the audio sample contained in the subframe. The column of data V 614 indicates the value of the validity flag of the audio sample contained in the subframe, and the column of data U 616 represents the single bit of user data carried by the subframe. The column of data C 618 represents the single bit of user data carrier by the subframe, and the column of data P 620 represents the single parity bit for the subframe. The column of data PChk 622 is an indication of whether the parity of the received subframe was correct. The Data 612, V 614, U 616, C 618, and P 620 fields represent the bits defined by the IEC 60958 standard, and that were discussed previously.

Although the DATA 612, V 614, U 616, C 618, and P 620 fields of information shown in each row of the table of FIG. 6 are all received within the same subframe of an SPDIF signal, portions of the subframe are processed by separate elements of the SPDIF encoder 100 shown in FIG. 1. If, for example, a modification was made to the design of the audio sample pipeline 110 in the SPDIF encoder 100 of FIG. 1 such that the audio sample pipeline 110 grew in processing length by one audio sample, the audio samples contained within the SPDIF signal 150 of the SPDIF encoder 100 may shift with respect to other data elements in the subframes of the SPDIF signal 150. The tabular arrangement of fields of information from the "shifted" SPDIF signal may then show that the values in the column of data DATA 612 are shifted upward or downward in the table, while the values of T 610 and C 618 remain in their original positions in the tabular arrangement. Because the audio sample field and the channel status field of an SPDIF signal subframe have no predefined timing relationship in an SPDIF signal, the data content of the SPDIF signal produce by the SPDIF encoder having the modified audio sample pipeline may appear to be incorrect using conventional verification tools. In fact, the output of the modified design may be correct. An embodiment of the present invention may use the method described below to verify the correctness of a simulated SPDIF signal, in spite of slips of values within one field with the simulated SPDIF signal with respect to values within other fields of the simulated SPDIF signal.

In one embodiment of the present invention, verification of a simulated SPDIF signal may be performed after the device simulation is completed, by analyzing the contents of a file containing the results of the device simulation stored during the simulation of the device. In such an embodiment, each of the individual data streams in the simulated SPDIF signal (e.g., DATA 612, V 614, U 616, C 618, P 620) may be collected and verified separately from other fields of the SPDIF signal subframes. The audio sample data may, for example, be extracted from a file, "spdif.dmp", comprising a sequence of entries such as those shown in the tabular arrangement of FIG. 6, using the UNIX command "cut-c3-8<spdif.dmp>samples.dmp", or a similar function. The resulting file, "samples.dmp", may then be compared to a file containing the expected audio sample data, independent of the information contained within the other fields of the subframes of the SPDIF signal.

Verification of the channel status bits such as, for example, C 618 of FIG. 6 of a simulated SPDIF signal may require more complicated post-processing of the data stored in the file. In an embodiment of the present invention, the channel status bits C 618 for each subframe of the 192 frames in a block may be gathered and converted to a sequence of 48 data bytes. The resulting bytes of channel status data may then be compared to a sequence of bytes representing the expected channel status. Verifying the audio sample payload, as was described above, and channel status bits separately, may confirm whether the SPDIF stream is valid regardless of the timing relationship of the audio sample payload and channel status data.

In another embodiment of the present invention, verification may be performed during the simulation of the SPDIF encoder by self-checking logic, and the audio sample data may be compared with expected values as the simulation progresses. Expected values used to check the contents of the fields of a simulated SPDIF signal may be made available for the verification by having the circuit simulator read a file containing the expected data values. In yet another embodiment, the audio sample data may be arranged to cycle through a signature pattern that self-checking logic recognizes. In an embodiment in accordance with the present invention, channel status bits may be verified independently, and therefore at any phase relative the audio sample data. This may be accomplished by first detecting the Z preamble of a subframe, and then comparing the channel status data to expected channel status values that are made available as an input port to the SPDIF checker, or that are read from a file. As described above, the Z preamble of an SPDIF signal signifies the start of a block of 192 SPDIF frames.

Figure 7:
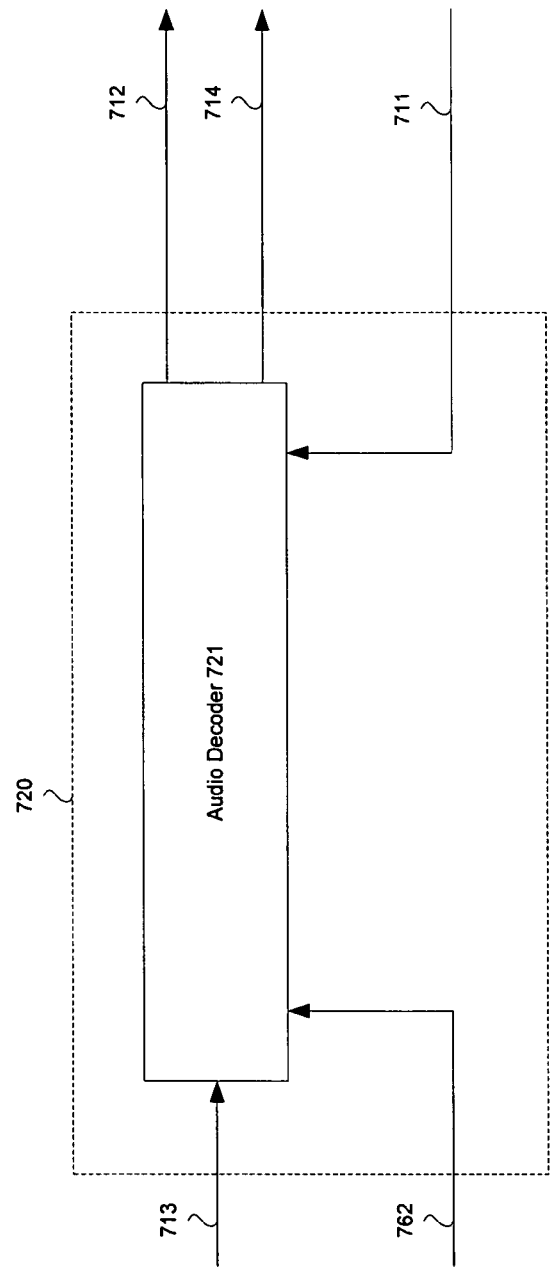
FIG. 7 shows an illustration of additional detail of an exemplary audio sample pipeline that may correspond, for example, to the audio sample pipeline of FIG. 1, in accordance with an embodiment of the present invention.

FIG. 7 shows an illustration of additional detail of an exemplary audio sample pipeline 720 that may correspond, for example, to the audio sample pipeline 120 of FIG. 1B, in accordance with an embodiment of the present invention. As shown in the illustration of FIG. 7, the audio sample pipeline 720 may comprise an audio decoder 721 receiving compressed or uncompressed audio data 713 which is processed to form audio sample data 712 and coupled along with validity data 714 to an SPDIF encoder such as, for example, the SPDIF formatter 140 of FIG. 1B. The audio sample pipeline 720 may use a processing clock and an output clock in performing this task. Control signal 762, that may correspond to the control signal 162 of FIG. 1B, may comprise a processing clock used to clock audio decoder 721 in the decompression of audio data in the audio sample pipeline 720. In addition, the clock signal 711, that may correspond to the clock signal 111 of FIG. 1B, may be related to the audio sample rate, $F_s$, and may act as an output clock for the audio decoder 721 in providing audio sample data to the SPDIF formatter 140 from the audio sample pipeline 720.

An SPDIF formatter such as, for example, the SPDIF formatter 140 of FIG. 1B may use the following information in the production of an SPDIF signal:
 1. frame preamble
 2. audio sample data
 3. channel status bit
 4. validity bit
 5. user data bit
 6. parity bit The SPDIF formatter 140, being the functional element producing an SPDIF signal, typically uses the output clock to time the audio sample data 712. Time misalignment between the transmission of, for example, the audio sample data 712, the frame preamble, and the channel status bit typically occurs because of the independent nature of the processing clock and the output clock. Due to variations in system reset duration, programming sequences, etc., the audio sample data 712 may shift in the frame order of the SPDIF signal from the SPDIF encoder relative to the preamble and/or the channel status bit, between various implementations of an SPDIF encoder such as, for example, the SPDIF formatter 140.

An embodiment in accordance with the present invention avoids this misalignment by synchronizing to a specific channel status bit in the outgoing SPDIF signal the audio data being supplied to the audio decoder such as, for example, the audio decoder 721, during the verification of the simulated SPDIF signal. This alignment is possible because the processing time of the audio decoder 721 is fixed and known. The alignment may be accomplished by compensating for the delays in the paths from the source of the audio sample data or particular data bit (e.g., C, P, U, V bits) to the output of the SPDIF formatter. In addition, an embodiment of the present invention may, for example, synchronize the sequence of validity (V) and user data (U) bits to a specific channel status (C) bit. This insures the alignment of all of the fields of a subframe. Once the alignment of the preamble, the audio sample data, the channel status bit, the validity bit, and the user data bit is achieved, an embodiment of the present invention may compare the contents of the simulated SPDIF encoder output signal with the contents of a reference or "golden" file that contains the expected contents of the SPDIF signal, beginning with the audio decoder output sample. A match of the simulation results with the contents of the reference or "golden" file indicates a properly functioning overall design for the SPDIF encoder under test.

Figure 8:
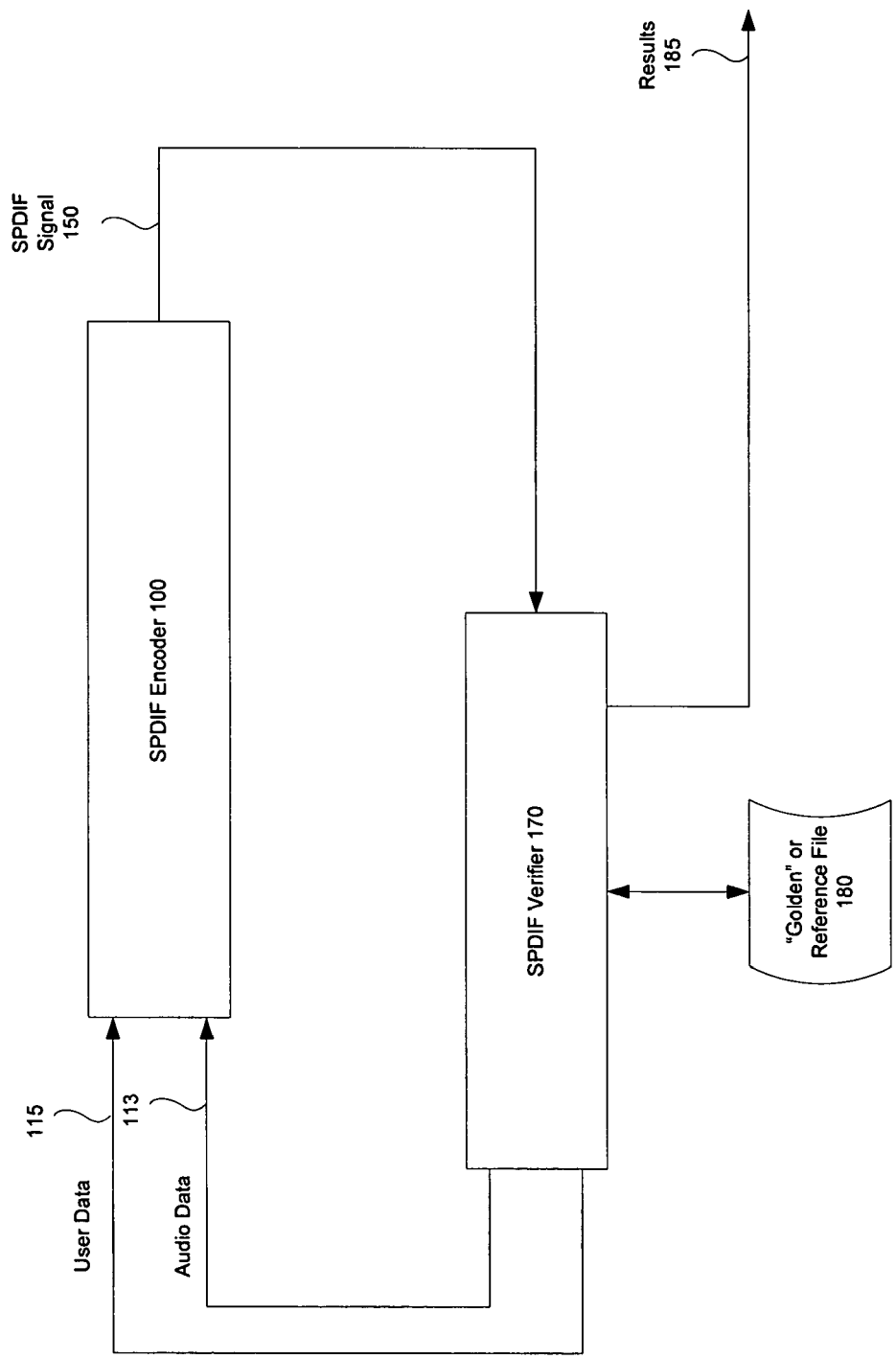
FIG. 8 shows the flow of information between code simulating an exemplary SPDIF encoder, and simulator code used to implement an SPDIF verifier, in accordance with an embodiment of the present invention.

FIG. 8 shows the flow of information between code simulating an exemplary SPDIF encoder 100, and simulator code used to implement an SPDIF verifier 170, in accordance with an embodiment of the present invention. In the illustration of FIG. 8, the SPDIF verifier 170 may, for example, provide to the simulated SPDIF encoder 100 user data 115 and audio data 113 to be encoded into an SPDIF signal 150. The user data 115 and audio data 113 may be based upon information stored in a "golden" or reference file 180. In an embodiment in accordance with the present invention, the data provided to the SPDIF encoder 100 by the SPDIF verifier 170 may be synchronized to the appearance of particular values in the fields of the encoded SPDIF signal 150. The SPDIF verifier 170 may receive and analyze the SPDIF signal 150 in order to extract, for example, audio sample data, validity (V) bits, user data(U) bits, channel status (C) bits, parity (P) bits, and clock information. Following extraction of information from the fields of the SPDIF signal 150 produced by the simulated SPDIF encoder 100, the code of the SPDIF verifier 170 may compare the extracted information against expected test results stored in the "golden" or reference file 180. The outcome of the comparison may be provided as results 185. The results 185 may, in various embodiments of the present invention, be stored in a file for later review and analysis, or may be displayed immediately to an operator of the simulator used for the testing the simulated SPDIF encoder 100.

Figure 9:
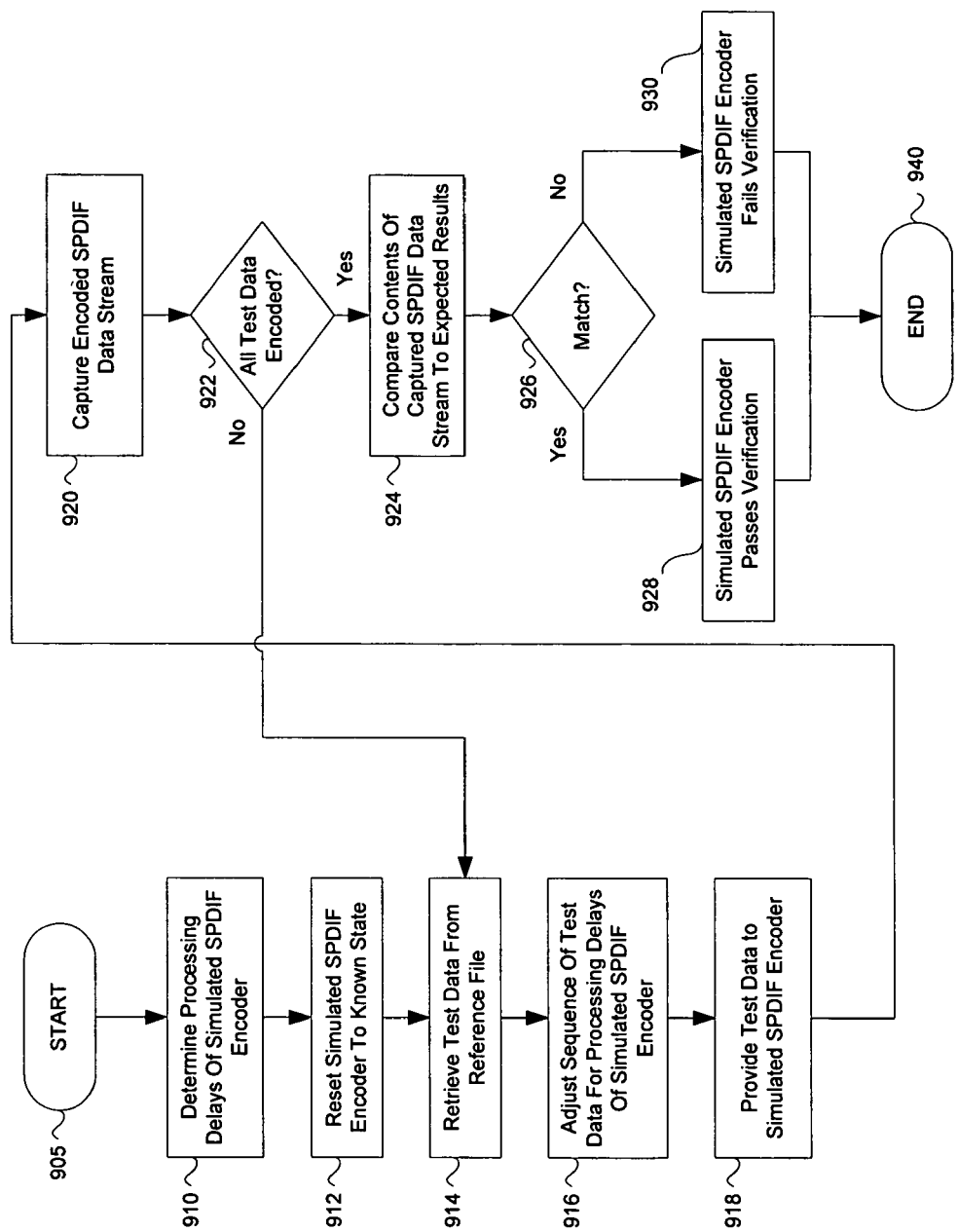
FIG. 9 shows a flowchart of an exemplary method of verifying a simulated SPDIF encoder such as, for example, the SPDIF encoder of FIG. 8, in accordance with an embodiment of the present invention.

FIG. 9 shows a flowchart of an exemplary method of verifying a simulated SPDIF encoder such as, for example, the SPDIF encoder 100 of FIG. 8, in accordance with an embodiment of the present invention. The method illustrated in FIG. 8 begins at the start state (905), after which the processing delays of the simulated SPDIF encoder are determined (910). The simulated SPDIF encoder is then reset to a known state (912). The SPDIF verifier then retrieves test data from a reference file (914), adjusts the test data for the processing delays of the simulated SPDIF encoder (916), and provides the test data to the SPDIF decoder being simulated (918). The SPDIF verifier may then capture the encoded SPDIF signal (920). A check is then made to determine whether all test data in the reference file has been encoded (922). If all test data has not been encoded by the simulated SPDIF encoder under test, the SPDIF verifier continues the testing by retrieving the next test data (914). If, however, all test data has been encoded, the SPDIF verifier may compare the captured SPDIF signal encoded by the simulated SPDIF encoder under test to results that are expected using the test data in the reference file (924). If the contents of the captured SPDIF signal is found to match the expected test results, the SPDIF verification passes (928), and the testing ends (940). If, however, the contents of the captured SPDIF signal fails to match the expected test results, the SPDIF verification fails (930), and the testing ends (940).

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method of verifying operation of an electronic circuit employing a software-based circuit simulator, the method comprising:

simulating the electronic circuit, the simulation producing at least a first simulated signal;

generating a simulated clock signal, wherein the simulated clock signal is adjusted using signal timing information extracted from the at least a first simulated signal;

parsing the at least a first simulated signal using the simulated clock signal; and determining whether the at least a first simulated signal matches a predetermined format based upon the parsed signal.

2. The method of claim 1 wherein the electronic circuit comprises a digital circuit.

3. The method of claim 1 wherein the at least a first simulated signal comprises a representation of audio information.

4. The method of claim 1 wherein the predetermined format comprises a representation compliant with the serial interface format specified by the Audio Engineering Society AES3-2003 standard.

5. The method of claim 1 further comprising:
retrieving electrical signal information from a storage device; and
setting a value of at least a second simulated signal using the retrieved electrical signal information.

6. The method of claim 5 wherein the setting comprises:
identifying the occurrence of a pre-selected pattern within the at least a first simulated signal; and
timing the setting of a value of the at least a second simulated signal relative to the occurrence of the identified pattern.

7. The method of claim 1 further comprising:
recording at least one result of at least one of the parsing and the determining.

8. A machine-readable storage, having stored thereon a computer program having a plurality of code sections for verifying operation of an electronic circuit, the code sections executable by a machine for causing the machine to perform the operations comprising:
simulating the electronic circuit, the simulation producing at least a first simulated signal;
generating a simulated clock signal, wherein the simulated clock signal is adjusted using signal timing information extracted from the at least a first simulated signal;
parsing the at least a first simulated signal using the simulated clock signal; and
determining whether the at least a first simulated signal matches a predetermined format based upon the parsed signal.

9. The machine-readable storage of claim 8 wherein the electronic circuit comprises a digital circuit.

10. The machine-readable storage of claim 8 wherein the at least a first simulated signal comprises a representation of audio information.

11. The machine-readable storage of claim 8 wherein the predetermined format comprises a representation compliant with the serial interface format specified by the Audio Engineering Society AES3-2003 standard.

12. The machine-readable storage of claim 8 further comprising:
retrieving electrical signal information from a storage device; and
setting a value of at least a second simulated signal using the retrieved electrical signal information.

13. The machine-readable storage of claim 12 wherein the setting comprises:
identifying the occurrence of a pre-selected pattern within the at least a first simulated signal; and
timing the setting of a value of the at least a second simulated signal relative to the occurrence of the identified pattern.

14. The machine-readable storage of claim 8 further comprising:
recording at least one result of at least one of the parsing and the determining.

15. A system for verifying operation of an electronic circuit, the system comprising:
at least one processor capable of simulating the electronic circuit, the simulation producing at least a first simulated signal;
the at least one processor capable of generating a simulated clock signal, wherein the simulated clock signal is adjusted using signal timing information extracted from the at least a first simulated signal;
the at least one processor capable of parsing the at least a first simulated signal using the simulated clock signal; and
the at least one processor capable of determining whether the at least a first simulated signal matches a predetermined format based upon the parsed signal.

16. The system of claim 15 wherein the electronic circuit comprises a digital circuit.

17. The system of claim 15 wherein the at least a first simulated signal comprises a representation of audio information.

18. The system of claim 15 wherein the predetermined format comprises a representation compliant with the serial interface format specified by the Audio Engineering Society AES3-2003 standard.

19. The system of claim 15 further comprising:
the at least one processor capable of retrieving electrical signal information from a storage device; and
the at least one processor capable of setting a value of at least a second simulated signal using the retrieved electrical signal information.

20. The system of claim 19 wherein the setting comprises:
identifying the occurrence of a pre-selected pattern within the at least a first simulated signal; and
timing the setting of a value of the at least a second simulated signal relative to the occurrence of the identified pattern.

21. The system of claim 15 further comprising:
the at least one processor capable of recording at least one result of at least one of the parsing and the determining.

22. A method of extracting timing information from a first simulated signal in a circuit simulator, the method comprising:
(A) initializing timing of a first time period;
(B) setting a second simulated signal to a first logic level and initializing timing of a second time period, if at least one of the completion of the first time period and a change in logic level of the first simulated signal has occurred;
(C) setting the second simulated signal to a second logic level and initializing timing of the first time period, if the second time period has completed;
(D) decoding the first simulated signal using the second simulated signal; and
(E) repeating (B) through (D).

* * * * *